United States Patent [19]
Ohuchi

[11] Patent Number: 6,084,293
[45] Date of Patent: Jul. 4, 2000

[54] STACKED SEMICONDUCTOR DEVICE

[75] Inventor: Shinji Ohuchi, Tokyo, Japan

[73] Assignee: Oki Electric Industry Co., Ltd., Tokyo, Japan

[21] Appl. No.: 09/120,119

[22] Filed: Jul. 22, 1998

[30] Foreign Application Priority Data

Jul. 25, 1997 [JP] Japan .................................... 9-215665
Nov. 25, 1997 [JP] Japan .................................... 9-340660

[51] Int. Cl.⁷ ......................... H01L 23/40; H01L 23/34; H01L 23/48; H01L 23/50; H05K 7/20
[52] U.S. Cl. ......................... 257/686; 257/685; 257/723; 257/778; 257/737; 257/738; 257/696; 257/693
[58] Field of Search ..................... 257/686, 723, 257/685, 696, 698, 734, 737, 738, 690, 693, 777, 778

[56] References Cited

U.S. PATENT DOCUMENTS

| | | | |
|---|---|---|---|
| 4,996,587 | 2/1991 | Hinrichsmeyer et al. | 257/686 |
| 5,138,438 | 8/1992 | Masayuki et al. | 257/686 |
| 5,554,886 | 9/1996 | Song | 257/686 |
| 5,586,009 | 12/1996 | Burns | 361/735 |
| 5,602,420 | 2/1997 | Ogata et al. | 257/686 |
| 5,625,221 | 4/1997 | Kim et al. | 257/686 |
| 5,650,920 | 7/1997 | Pfizenmayer | 361/782 |
| 5,723,901 | 3/1998 | Katsumata | 257/686 |
| 5,723,903 | 3/1998 | Masuda et al. | 257/696 |
| 5,744,827 | 4/1998 | Jeong et al. | 257/686 |
| 5,747,874 | 5/1998 | Seki et al. | 257/686 |
| 5,754,408 | 5/1998 | Derouiche | 361/773 |
| 5,760,471 | 6/1998 | Fujisawa et al. | 257/686 |
| 5,801,437 | 9/1998 | Burns | 257/685 |
| 5,811,877 | 9/1998 | Miyano et al. | 257/706 |
| 5,818,107 | 10/1998 | Pierson et al. | 257/686 |
| 5,821,615 | 10/1998 | Lee | 257/686 |
| 5,835,988 | 11/1998 | Ishii | 257/686 |
| 5,895,969 | 4/1999 | Masuda et al. | 257/696 |
| 5,978,227 | 11/1999 | Burns | 361/735 |
| 5,986,209 | 11/1999 | Tandy | 174/52.4 |

*Primary Examiner*—Alexander Oscar Williams
*Attorney, Agent, or Firm*—Rabin & Champagne, P.C.

[57] ABSTRACT

In a stack type semiconductor device 1, front ends of leads 11 provided at two sides of a first semiconductor device 10 are bent inward to hold a second semiconductor device 20 stacked at the rear surface of the first semiconductor device 10. Since the second semiconductor device 20 is held toward the inside relative to the leads 11 of the first semiconductor device 10, the distance between the outer surfaces of the leads 11 does not increase. Thus, the mounting area does not increase compared to the mounting area required when mounting a single first semiconductor device 10, and furthermore, high density mounting becomes possible by stacking the second semiconductor device 20.

13 Claims, 9 Drawing Sheets

STACKED SEMICONDUCTOR DEVICE

BACKGROUND OF THE INVENTION

The present invention relates to a semiconductor device that is suitable for high density mounting, and to methods for manufacturing and mounting this semiconductor device.

In recent years, the rapid technological growth in the field of IC cards and memory cards has resulted in the need for thinner and more compact resin-sealed semiconductor devices to be mounted in the cards. In addition, stack type semiconductor devices achieved by stacking semiconductor devices over two stages or three or more stages have been proposed for memory modules and the like.

For instance, DIP (Dual Inline Package) semiconductor devices 100, one of which is illustrated in FIG. 15, may be employed to achieve a stack type semiconductor device 103 by stacking the semiconductor devices 100 one on top of the other and electrically connecting leads 101 provided at the side surfaces of the semiconductor devices 100 with solder 102 or the like, as illustrated in FIG. 16. In addition, a stack type semiconductor device 108 which is achieved by employing an SOJ (Small Outline J-bend Package) semiconductor device 106 having leads 105 bent in a "J" shape, as illustrated in FIG. 17, stacking a DIP type semiconductor device 100 on top of it and electrically connecting their leads 105 and 101 with solder 107 or the like, as illustrated in FIG. 18, has also been proposed. These semiconductor devices 106 and 100 are formed thin enough that the semiconductor device 108 has a height that is equivalent to that of one regular SOJ type semiconductor device. The stack type semiconductor devices 103 and 108, are each constituted by stacking semiconductor devices over two stages to achieve high density mounting and can store twice as much information.

However, since the leads 101 must be inserted at through holes to mount the stack type semiconductor device 103 illustrated in FIG. 16 at a substrate, double mounting cannot be achieved. Because of this, even though the semiconductor device 103 in FIG. 16 is constituted by multistage stacking, it is difficult to achieve high density mounting since double mounting is not possible.

In addition, in the stack type semiconductor device 108 illustrated in FIG. 18, the outer surfaces of the solder 107 connecting the leads 105 and 101 project out at the two sides to the left and the right. Because of this, the distance L107 between the outer surfaces of the solder 107 is greater than the distance L105 between the outer surfaces of the SOJ leads 105. Consequently, due to the projecting solder 107, the stack type semiconductor device 108 illustrated in FIG. 18 requires a greater mounting area compared to the mounting area required for mounting the semiconductor device 106 by itself, which represents an obstacle to achieving high density mounting. In particular, such an increase in the mounting area cannot be allowed when ultra high density mounting, in which the element footprint is under rigorous restriction, is to be implemented.

SUMMARY OF THE INVENTION

Accordingly, an object of the present invention is to provide a new and improved stack type semiconductor device which achieves high density mounting without increasing the mounting area compared to the mounting area required when mounting a single semiconductor device, and methods for manufacturing and mounting such a stack type semiconductor device.

Another object of the present invention is to provide a new and improved semiconductor device that may be employed in an ideal manner in such a stack type semiconductor device.

In order to achieve the objects described above, in a first aspect of the present invention, a stack type semiconductor device constituted by stacking a plurality of semiconductor devices, which is characterized in that the front ends of leads provided at the two sides of a first semiconductor device located at the outermost position when mounted are bent inward to hold a second semiconductor device that is stacked at the rear surface of the first semiconductor device, is provided.

In this stack type semiconductor device, since the second semiconductor device is held further inward relative to the leads of the first semiconductor device, the distance between the outer surfaces of the leads does not increase. Thus, compared to the mounting area required when mounting the first semiconductor device by itself, no increase in the mounting area is required, and by stacking the second semiconductor device, high density mounting becomes possible. Furthermore, a plurality of second semiconductor devices may be provided, instead of a single second semiconductor device. In other words, there is a possibility with the stack type semiconductor device disclosed in claim 1 that a plurality of second semiconductor devices may be stacked at the rear surface of the first semiconductor device.

In such a stack type semiconductor device, it is desirable that the leads of the first semiconductor device be formed in a "J" shape. By forming the leads in a "J" shape in this manner, a high density type semiconductor device having several times the capacity of an SOJ type semiconductor device in the prior art, which has been in wide use, can be achieved while requiring the same mounting area. Another advantage is that sockets identical to those for SOJ type semiconductor devices used in the prior art can be employed for testing. Furthermore, it becomes possible to prevent the leads from becoming deformed. Alternatively, solder balls maybe provided between the leads of the first semiconductor device and the leads of the second semiconductor device. By melting the solder balls through heating, the leads of the first semiconductor device and the leads of the second semiconductor device can be electrically connected with ease. In this case, if the leads of the second semiconductor device are positioned further inward relative to the leads of the first semiconductor device, the leads can be electrically connected toward the inside relative to the leads of the first semiconductor device to ensure that the solder will not project out at the two sides to the left and the right of the leads of the first semiconductor device and, consequently, that the mounting area will not increase.

In addition, in order to achieve the objects described above, in a second aspect of the present invention, a method for manufacturing a stack type semiconductor device, which is characterized in that a second semiconductor device that is stacked at the rear surface of a first semiconductor device, having leads at the two sides thereof, is held by the front ends of the leads of the first semiconductor device that are bent inward, is provided. By adopting this method, it becomes possible to manufacture a stack type semiconductor device that achieves high density mounting without an increase in the mounting area. It is to be noted that it is desirable to provide solder balls between the leads of the first semiconductor device and the leads of the second semiconductor device.

Furthermore, in order to achieve the objects described above, in a third aspect of the present invention, a semiconductor device which is characterized in that a lead which lies astride the front and rear surfaces of the semiconductor device is provided at the two sides of the semiconductor device. Since the leads of such semiconductor devices, which lie astride the front and rear surfaces of the semiconductor device, can be abutted with each other with ease simply by stacking the semiconductor devices, such a semiconductor device is ideal for manufacture of a stacked semiconductor device.

Moreover, it is desirable to provide solder balls at the front surfaces and/or the rear surfaces of the leads in such a semiconductor device. This will make it possible to electrically connect the leads with ease simply by applying heat when manufacturing a stack type semiconductor device and will also facilitate mounting thereof at a substrate.

Also, in a fourth aspect of the present invention, a stack type semiconductor device constituted by stacking a plurality of semiconductor devices, which is characterized in that a second semiconductor device stacked at the rear surface of a first semiconductor device located at the outermost position when mounted is held further toward the inside relative to gull-wing shaped leads at the two sides of the first semiconductor device, is provided.

In this stack type semiconductor device in which the second semiconductor device is held further toward the inside of the leads of the first semiconductor device, the distance between the outer surfaces of the leads does not increase. Thus, the mounting area does not increase compared to the mounting area required when mounting the first semiconductor device by itself. Furthermore, by stacking the second semiconductor device, high density mounting becomes possible. It is to be noted that a plurality of second semiconductor devices may be provided instead of a signal second semiconductor device. In other words, there is a possibility with this stack type semiconductor device, too, that a plurality of second semiconductor devices are stacked at the rear surface of the first semiconductor device.

In addition, it is desirable to provide solder balls at the leads positioned at the rear surface of the second semiconductor device in the stack type semiconductor device described above, since, by melting the solder balls through heat application, the leads of the first semiconductor device and the leads of the second semiconductor device can be electrically connected with ease.

Furthermore, in order to achieve the objects described above, in a fifth aspect of the present invention, a method for mounting a semiconductor device which is characterized in that by positioning a first semiconductor device provided with leads at the two sides thereof toward the outside and positioning a second semiconductor device having solder balls at their leads provided at the rear surface thereof, the second semiconductor device is provided toward the inside relative to the leads of the first semiconductor device at a substrate surface to mount the first semiconductor device and the second semiconductor device at the substrate surface. By adopting this method, high density mounting is achieved without an increase in the mounting area at the substrate surface. It is to be noted that it is desirable to mount the first semiconductor device and the second semiconductor device at the substrate surface at the same time.

Moreover, in order to achieve the objects described above, in a sixth aspect of the present invention, a stack type semiconductor device constituted by stacking a plurality of semiconductor devices, which is characterized in that leads positioned at the rear surface of a first semiconductor device located at the outermost position when mounted and leads positioned at the two sides of a second semiconductor device stacked at the rear surface of the first semiconductor device are electrically connected via solder, is provided. It is to be noted that a plurality of first semiconductor devices instead of a single first semiconductor device may be provided in such a stack type semiconductor device. In addition, the leads of the second semiconductor device may be formed in a "J" shape, for instance, so that the same sockets as those used with an SOJ type semiconductor device in the prior art can be employed for testing and that the leads are prevented from becoming deformed.

Moreover, in order to achieve the objects described above, in a seventh aspect of the present invention, a method for manufacturing a stack type semiconductor device which is characterized in that a first semiconductor having solder balls provided at leads at the rear surface thereof and a second semiconductor device having leads at the two sides thereof are stacked with a first semiconductor device positioned on the outside and the second semiconductor device positioned on the inside and in that the leads of the first semiconductor device and the leads of the second semiconductor device are electrically connected by solder, is provided. By adopting this method, too, it becomes possible to manufacture a stack type semiconductor device that achieves high density mounting without an increase in the mounting area.

Furthermore, in order to achieve the objects described above, in an eighth aspect of the present invention, a method for mounting a semiconductor device, which is characterized in that a first semiconductor device having solder balls at leads at the rear surface thereof and a second semiconductor device having leads at the two sides thereof are stacked at the surface of a substrate, with the first semiconductor device positioned on the outside and the second semiconductor device positioned on the inside, to mount the first semiconductor device and the second semiconductor device at the same time at the substrate surface, is provided. By adopting this method, too, it becomes possible to achieve high density mounting without an increase in the mounting area at the substrate surface.

Moreover, in order to achieve the objects described above, in a ninth aspect of the present invention, a stack type semiconductor device having a first semiconductor device provided with a plurality of leads extending from the two sides thereof and a second semiconductor device provided toward the inside relative to the first semiconductor device and having ball electrodes at the rear surface thereof, is provided. In the stack type semiconductor device, the ball electrodes may assume a structure in which solder balls are provided at leads positioned at the rear surface of the second semiconductor device, for instance. In addition, a structure in which the leads of the first semiconductor element and the ball electrodes of the second semiconductor device corresponding to the leads are commonly connected to a conductive pattern formed at the surface of the substrate may be adopted.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is an explanation of the preferred embodiments of the present invention in reference to the drawings. It is to be noted that the same reference numbers are assigned to components having almost identical functions and structural features in the following explanation and the attached drawings to preclude the necessity for repeated explanation thereof.

Figure 1:
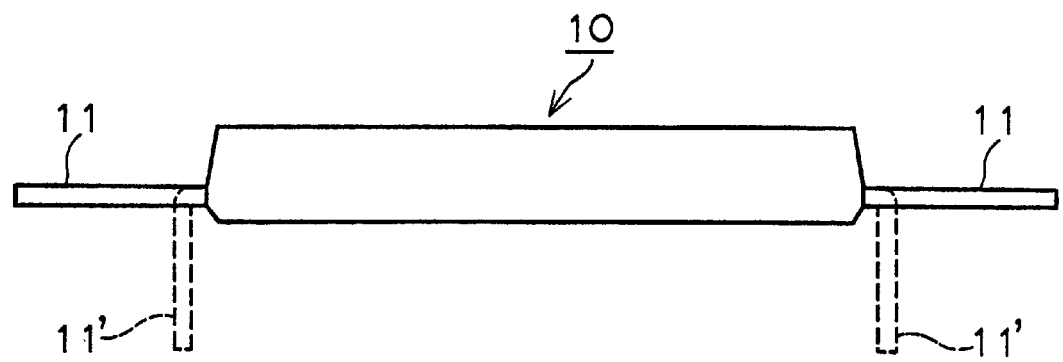
FIG. 1 is a front view of a first semiconductor device which is ideal for application in manufacturing the stack type semiconductor device in a first embodiment of the present invention.
Figure 2:
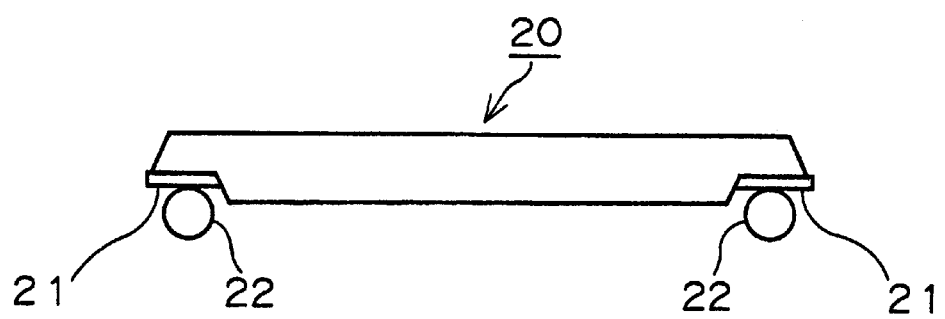
FIG. 2 is a front view of a second semiconductor device which is ideal for application in manufacturing the stack type semiconductor device in the first embodiment of the present invention.

FIG. 1 is a front view of a first semiconductor device 10 and FIG. 2 is a front view of a second semiconductor device 20, which are ideal for application in manufacturing a stack type semiconductor device 1 in the first embodiment of the present invention.

As illustrated in FIG. 1, leads 11 for implementing input/output of an electrical signal for a semiconductor element (not shown) which is internally provided in the first semiconductor device 10 are provided at the two sides to the left and the right of the first semiconductor device 10. It is to be noted that a plurality of leads 11 are provided at each of the two sides to the left and the right of the first semiconductor device 10. In addition, while the leads 11 are each formed in a shape spreading either to the left or the right side of the first semiconductor device 10 in the example presented in the figure, the leads 11 may be instead formed to bend downward at a right angle, as illustrated by the broken lines 11' in FIG. 1, for instance.

As illustrated in FIG. 2, the second semiconductor device 20 is constituted of a semiconductor device which is commonly referred to as a Small Outline Ball (SOB) semiconductor device. Namely, leads 21 are provided at the two sides to the left and right at the rear surface (the bottom surface in the example presented in the figure) of the second semiconductor device 20. These leads 21 have a length at which the leads 21 do not project out to the two sides to the left and right of the second semiconductor device 20. In addition, a solder ball 22 which will function as an electrical connector when mounting the second semiconductor device 20 at a substrate or the like is mounted at each of the leads 21.

Figure 3:
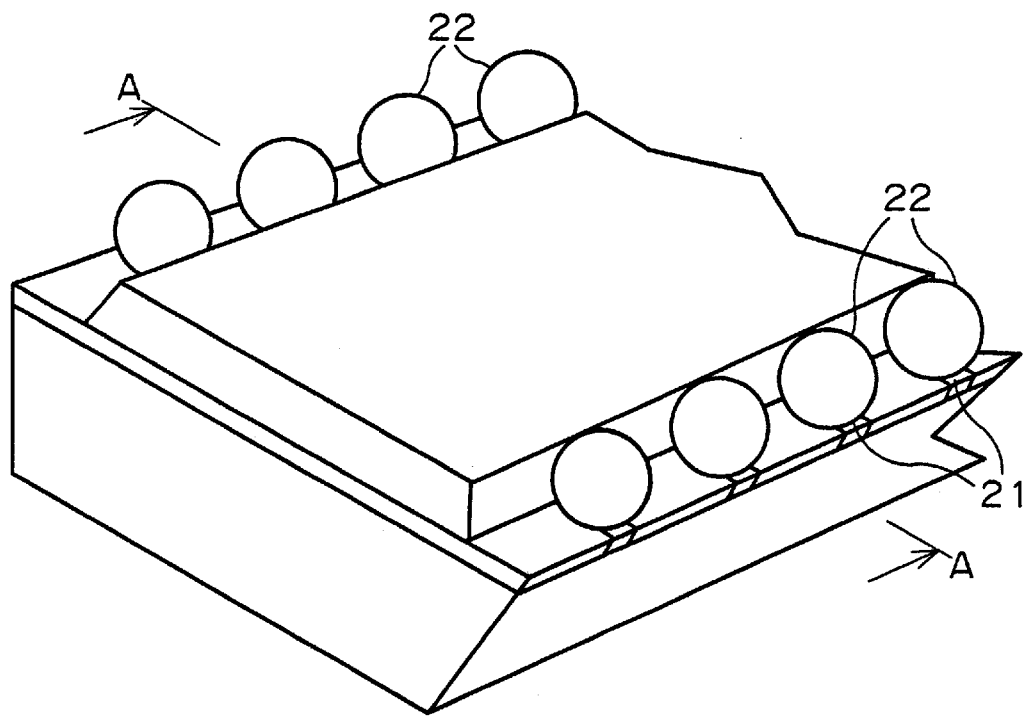
FIG. 3 is a perspective of the rear surface of the second semiconductor device.
Figure 4:
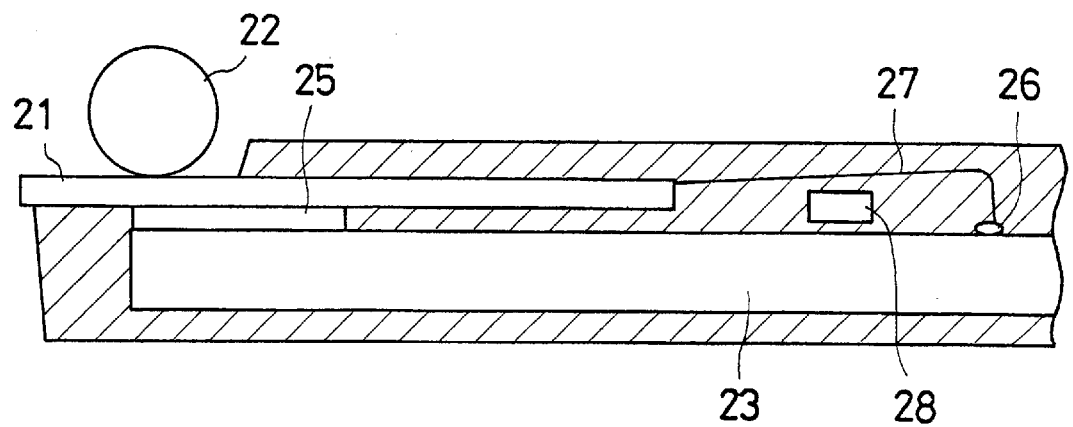
FIG. 4 is an enlarged cross section along line A—A in FIG. 3.

FIG. 3 is a perspective of the rear surface of the second semiconductor device 20, and FIG. 4 is an enlarged cross section along line A—A in FIG. 3. As illustrated in FIG. 3, a plurality of leads 21 and a plurality of solder balls 22 are provided over specific intervals at both sides to the left and right of the rear surface of the semiconductor device 20. As illustrated in FIG. 4, a semiconductor element 23 is sealed with resin 24 inside the second semiconductor device 20. The example in the figure assumes a structure in which the leads 21 are mounted at a surface of the semiconductor element 23 via an insulating tape 25 and the semiconductor element 23 and the leads 21 are secured as an integrated unit with the resin 24. The leads 21 are electrically connected with a terminal 26 formed at a surface of the semiconductor element 23 via a conductor wire 27 such as, for instance, a gold wire so that input/output of an electrical signal is implemented for the semiconductor element 23 via the leads 21. In addition, a source line 28 for supplying a source current to the semiconductor element 23 is provided inside the resin 24.

Figure 5:
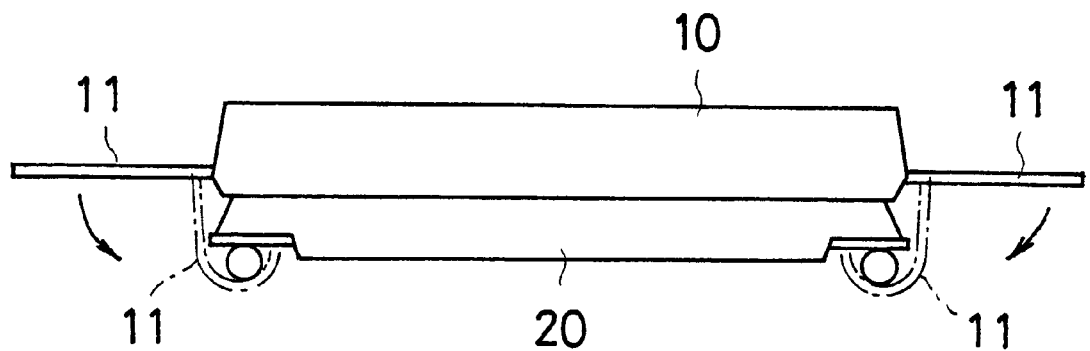
FIG. 5 illustrates a manufacturing step for manufacturing the stack type semiconductor device in the first embodiment of the present invention.

Next, the stack type semiconductor device 1 in the first embodiment of the present invention is explained by following the sequence of its manufacturing processes. First, as illustrated in FIG. 5, the second semiconductor device 20 is stacked from below at the rear surface (the bottom surface in the example presented in the figure) of the first semiconductor device 10. The production of the stack type semiconductor device 1 will be facilitated if the front surface (the upper surface in the example presented in the figure) of the second semiconductor device 20 is temporarily secured to the rear surface of the first semiconductor device 10 by using an adhesive or the like at this point.

Figure 6:
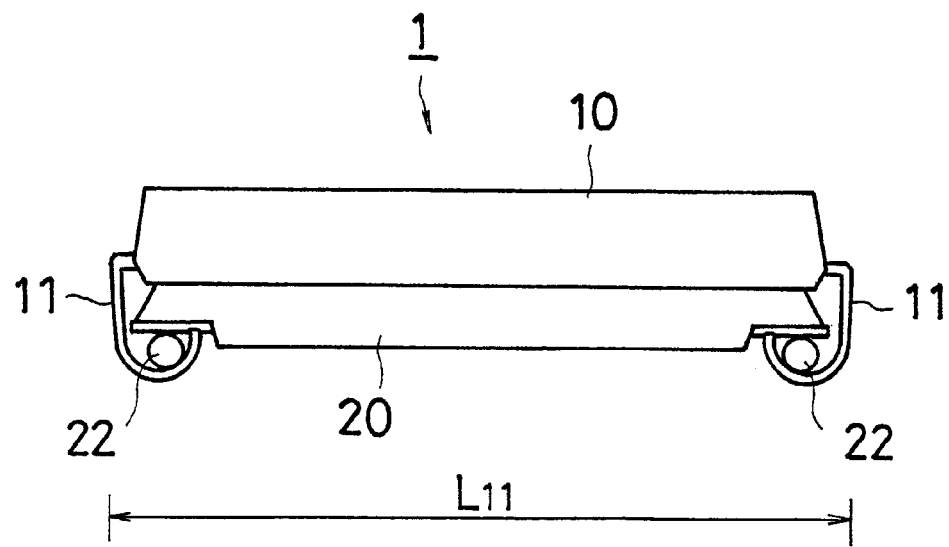
FIG. 6 is a front view of the stack type semiconductor device in the first embodiment of the present invention.

Next, the leads 11 of the first semiconductor device 10 are bent downward at a right angle and then the front ends of the leads 11 are bent inward to achieve a "J" shape for the leads 11. It is to be noted that if the leads 11 are already bent downward, it is only necessary to bend inward the front ends of the leads 11. Thus, as illustrated in FIG. 6, the solder balls 22 provided at the two sides to the left and right of the rear surface of the second semiconductor device 20 are enclosed by the leads 11 of the first semiconductor device 10 so that the second semiconductor device 20 is held at the rear surface of the first semiconductor device 10.

The stack type semiconductor device 1 in the first embodiment is manufactured through the sequence described above. It is to be noted that a further step may be implemented after the above process for heat application as necessary to electrically connect the leads 11 of the first semiconductor device 10 and the leads 21 of the second semiconductor device 20 by melting the solder balls 22.

In the stack type semiconductor device 1 in the first embodiment manufactured as described above, the second semiconductor device 20 is held toward the inside relative to the leads 11 of the first semiconductor device 10, and since the solder used for connecting the leads 11 of the first semiconductor device 10 and the leads 21 of the second semiconductor device 20 does not jut out at the sides, the distance L11 between the outer surfaces of the leads 11 remains equal to and no greater than the distance between the outer surfaces when the first semiconductor device 10 is used by itself. Consequently, the mounting area does not increase compared to the mounting area required when mounting the first semiconductor device 10 by itself, and furthermore, with the second semiconductor device 20 stacked on it, high density mounting becomes possible.

It is to be noted that by forming see leads 11 of the first semiconductor device 10 in a "J" shape, as explained in reference to the first embodiment, a high density type semiconductor device 1 having twice the capacity of an SOJ type semiconductor device widely used in the prior art is achieved while maintaining an identical external shape or requiring the same mounting area. In addition, a degree of convenience is achieved since the same sockets as those used with SOJ type semiconductor devices in the prior art can be employed for testing. Furthermore, by forming the leads 11 in a "J" shape, the leads 11 are prevented from becoming deformed.

Figure 7:
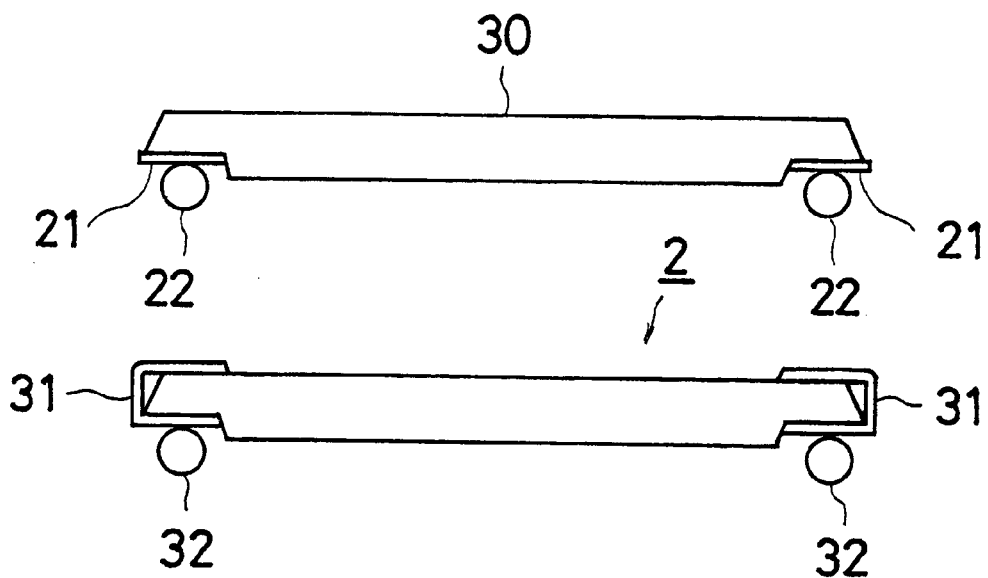
FIG. 7 is a front view of the semiconductor device in a second embodiment of the present invention.

Next, FIG. 7 presents a front view of a semiconductor device 2 in the second embodiment of the present invention. It is to be noted that in FIG. 7, a second semiconductor device 30 to be stacked at the front surface (the upper surface in the example presented in the figure) of the semiconductor device 2 is also illustrated. Since the structure of the second semiconductor device 30 is identical to that of the second semiconductor device 20 explained earlier in reference to FIGS. 2–4, the same reference numbers as those in FIG. 2 are assigned to identical components to preclude the necessity for a detailed explanation thereof.

As illustrated in FIG. 7, leads 31 lying astride the front surface and the rear surface (the upper and lower surfaces in the example presented in the figure) of the semiconductor device 2 are provided at the two sides to the left and right of the semiconductor device 2. Input/output of an electrical signal is implemented for a semiconductor element (not shown) which is internally provided in the semiconductor device 2 via the leads 31. In addition, solder balls 32 are mounted at the lower surfaces of the leads 31. It is to be noted that the semiconductor device 2 in the second embodiment may be constituted by extending the leads 21 of the second semiconductor device 20 explained earlier in reference to FIGS. 2–4 to the front surface, for instance.

Since the leads 31 of the semiconductor device 2 in the second embodiment lie astride the front surface and the rear surface of the semiconductor device 2, the leads 31 can be easily abutted with each other simply by stacking the semiconductor devices 2 to facilitate the production of a stack type semiconductor device.

Figure 8:
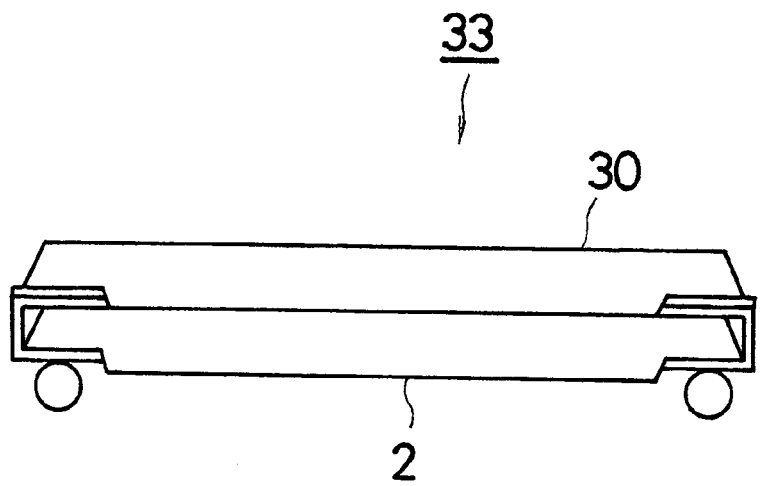
FIG. 8 is a front view of the stack type semiconductor device constituted by stacking a second semiconductor device at the front surface of the semiconductor device in the second embodiment of the present invention.

In addition, as illustrated in FIG. 7, for instance, the leads 21 of the second semiconductor device 30 can be abutted to the leads 31 of the semiconductor device 2 simply by stacking the second semiconductor device 30 at the front surface (the upper surface) of the semiconductor device 2. Then, by applying heat in this state in which the second semiconductor device 30 is stacked at the front surface (the upper surface) of the semiconductor device 2 to melt the solder balls 22 mounted at the leads 21 of the second semiconductor device 30, the leads 31 of the semiconductor device 2 and the leads 21 of the second semiconductor device 30 can be electrically connected with ease. Thus, a stack type semiconductor device 33 constituted by stacking the second semiconductor device 30 at the front surface of the semiconductor device 2, as illustrated in FIG. 8, can be manufactured.

Furthermore, with the solder balls 32 mounted at the lower surface of the leads 31 of the semiconductor device 2, the stack type semiconductor device 33 manufactured as described above can be easily mounted at a substrate simply through heat application. It is to be noted that the total thickness of the semiconductor device 2 and the second semiconductor device 30 stacked together in this stack type semiconductor device 33 can be reduced by approximately 0.4 mm compared to, for instance, the stack type semiconductor device 1 explained earlier in reference to FIG. 6. The total height of the stack type semiconductor device 33 is approximately 1.2 mm at most and therefore, it is ideal in application in a thin module such as a memory card.

Figure 9:
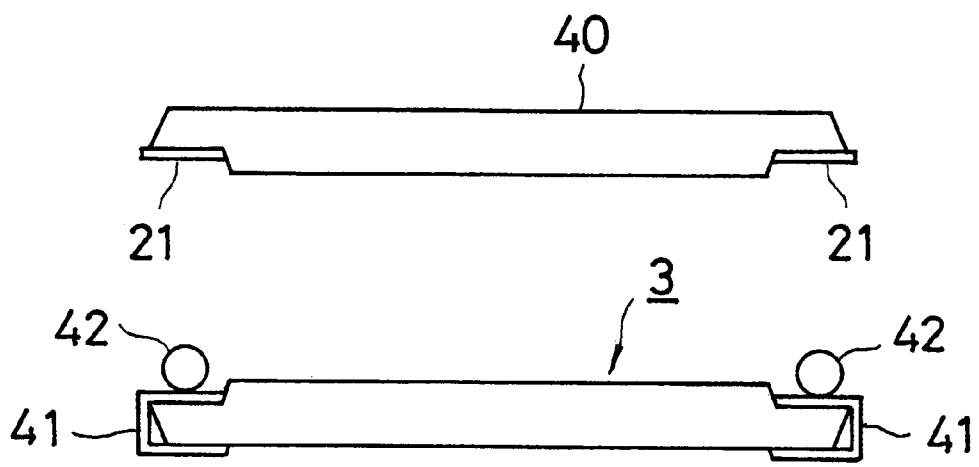
FIG. 9 is a front view of a semiconductor device in a third embodiment of the present invention.

Next, FIG. 9 is a front view of a semiconductor device 3 in the third embodiment of the present invention. It is to be noted that in FIG. 9, too, a second semiconductor device 40 to be stacked at the front surface (the upper surface in the example presented in the figure) of the semiconductor device 3 is shown together. Since the structure of the second semiconductor device 40 is identical to that of the second semiconductor device 20 explained earlier in reference to FIGS. 2–4 except that it is not provided with the solder balls 22, the same reference numbers as those in FIG. 2 are assigned to identical components to preclude the necessity for a detailed explanation thereof.

As FIG. 9 illustrates, leads 41 are provided lying astride the front surface and the rear surface (the upper and lower surfaces in the example presented in the figure) of the semiconductor device 3 at the two sides to the left and right of the semiconductor device 3, as in the semiconductor device 2 in the second embodiment explained earlier so that input/output of an electrical signal is implemented for a semiconductor element (not shown) provided internally in the semiconductor device 3 via the leads 41. However, in the semiconductor device 3, solder balls 42 are mounted at the upper surfaces of the leads 41.

Since the leads 41 lie astride the front surface and the rear surface of the semiconductor device 3 in the semiconductor device 3 in the third embodiment, too, the leads 41 can be abutted with each other with ease simply by stacking together the semiconductor devices 3 to facilitate the production of a stack type semiconductor device.

Figure 10:
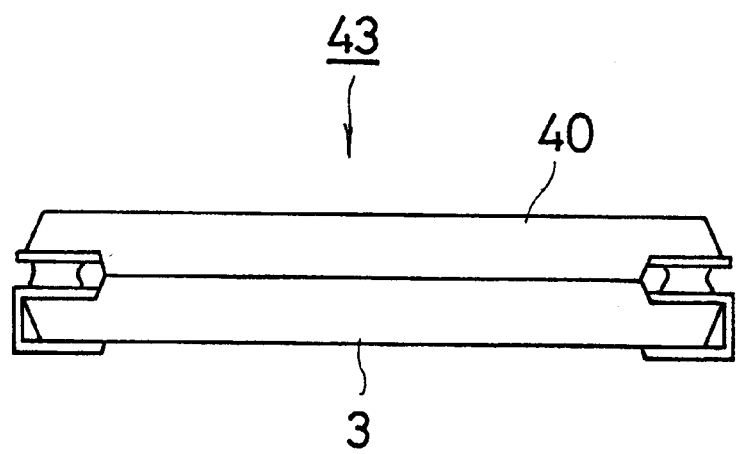
FIG. 10 is a front view of the stack type semiconductor device constituted by stacking a second semiconductor device at a front surface of the semiconductor device in the third embodiment of the present invention.

In addition, as illustrated in FIG. 9, for instance, simply by stacking the second semiconductor device 40 at the front surface (the upper surface) of the semiconductor device 3, the leads 21 of the second semiconductor device 40 can be abutted with the leads 41 of the semiconductor device 3. Then, by applying heat in this state, in which the second semiconductor device 40 is stacked at the front surface (the upper surface) of the semiconductor device 3 to melt the solder balls 42 mounted at the leads 41 of the semiconductor device 3, the leads 41 of the semiconductor device 3 and the leads 21 of the second semiconductor device 40 can be electrically connected with ease. Through this process, a stack type semiconductor device 43 constituted by stacking the second semiconductor device 40 at the front surface of the semiconductor device 3 as illustrated in FIG. 10, is manufactured. Since the thickness of the stack type semiconductor device 43 manufactured in this manner, too, can be reduced by approximately 0.4 mm compared to that of the stack type semiconductor device 1 explained earlier in reference to FIG. 6 with its total height kept at approximately 1.2 mm at most, the stack type semiconductor device 43 proves ideal in application in a thin module such as a memory card.

Figure 11:
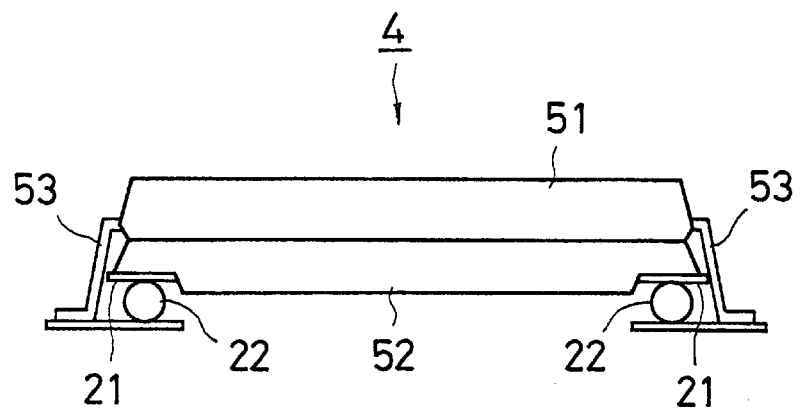
FIG. 11 is a front view of the stack type semiconductor device in a fourth embodiment of the present invention.
Figure 12:
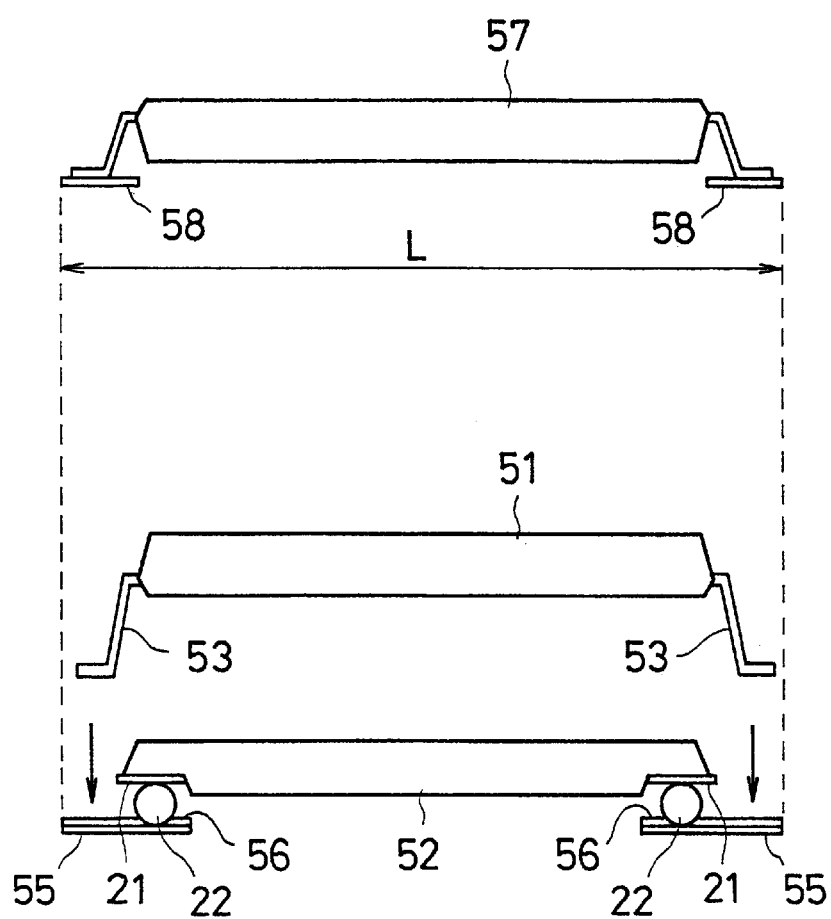
FIG. 12 is an exploded view illustrating the method for mounting the stack type semiconductor device in the fourth embodiment of the present invention at the surface of a substrate.

Next, FIG. 11 is a front view of the stack type semiconductor device 4 in the fourth embodiment of the present invention and FIG. 12 is an exploded view illustrating the method for mounting the stack type semiconductor device 4 at the substrate surface. As illustrated in FIG. 11, this stack type semiconductor device 4 is constituted by stacking a second semiconductor device 52 at the rear surface (the lower surface in the example presented in the figure) of a first semiconductor device 51. The first semiconductor device 51 is constituted of a so-called Small Outline Package (SOP) semiconductor device. Namely, leads 53 for implementing input/output of an electrical signal for a semiconductor element (not shown) that is internally provided in the first semiconductor device 51 are provided at the two sides to the left and right of the first semiconductor device 51. A plurality of leads 53, which are formed in a gull-wing shape, are provided at each of the two sides to the left and right of the first semiconductor device 51.

Since the second semiconductor device 52 is structured identically to the second semiconductor device 20 explained earlier in reference to FIGS. 2–4, the same reference numbers as those in FIG. 2 are assigned to identical components to preclude the necessity for a detailed explanation thereof. In the stack type semiconductor device 4, the second semiconductor device 52 is held toward the inside relative to the leads 53 of the first semiconductor device 51 by stacking the second semiconductor device 52 from below at the rear surface of the first semiconductor device 51.

Now, the process for mounting the stack type semiconductor device 4 is explained in reference to FIG. 12. First, a solder paste 56 is applied onto footprints 55 (portions where the semiconductor portions are electrically connected for mounting) formed at the front surface of a substrate (not shown), and solder balls 22 mounted at the lower surfaces of leads 21 of the second semiconductor device 52 are placed onto the solder paste 56. Then, by stacking the first semiconductor device 51 onto the second semiconductor device 52, the leads 53 of the first semiconductor device 51 are placed on the footprints 55 onto which the solder paste 56 has been applied. By placing the leads 53 of the first semiconductor device 51 adjacent to and on the outside of the leads 21 of the second semiconductor device 52 in this manner, the second semiconductor device 52 is placed toward the inside relative to the leads 53 of the first semiconductor device 51 at the substrate surface. After this, heat is applied to raise the temperature to melt the solder balls 22 mounted at the lower surfaces of the leads 21 of the second semiconductor device 52 and the solder 56 applied onto the footprints 55 to electrically connect the leads 53 and the leads 21 on the footprints 55 and mount the first semiconductor device 51 and the second semiconductor device 52 at the substrate surface at the same time.

Since the second semiconductor device 52 is held toward the inside relative to the leads 53 of the first semiconductor device 51 in the stack type semiconductor device 4 in the fourth embodiment mounted at the substrate surface in this manner, the distance between the outer surfaces of the leads 53 does not increase. As a result, the external width L of the footprints 55 formed at the substrate surface can remain approximately equal to the external width L of footprints 58 for mounting a semiconductor device (SOP) 57 which is widely employed in the prior art and is also illustrated in FIG. 12 for reference. Thus, the mounting area does not increase compared to the mounting area required when mounting the semiconductor device 57 in the prior art by itself. Moreover, high density mounting becomes possible by stacking the second semiconductor device 52. It is to be noted that it is desirable to form the footprints 55 to extend inward so that the leads 21 of the second semiconductor device 52 can be connected to the footprints 55 toward the inside relative to the leads 53 of the first semiconductor device 52.

Figure 13:
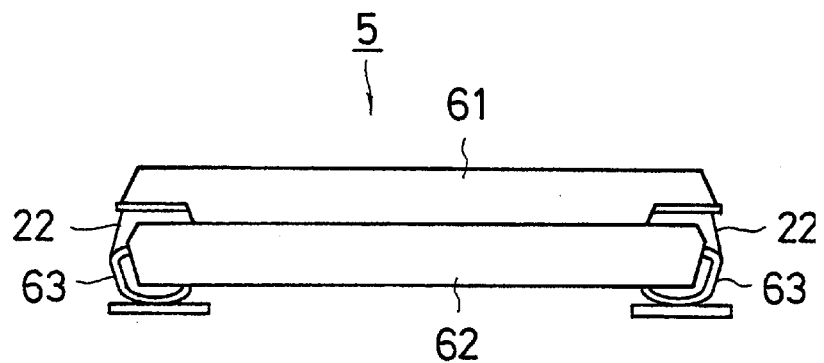
FIG. 13 is a front view of the stack type semiconductor device in the fifth embodiment of the present invention.
Figure 14:
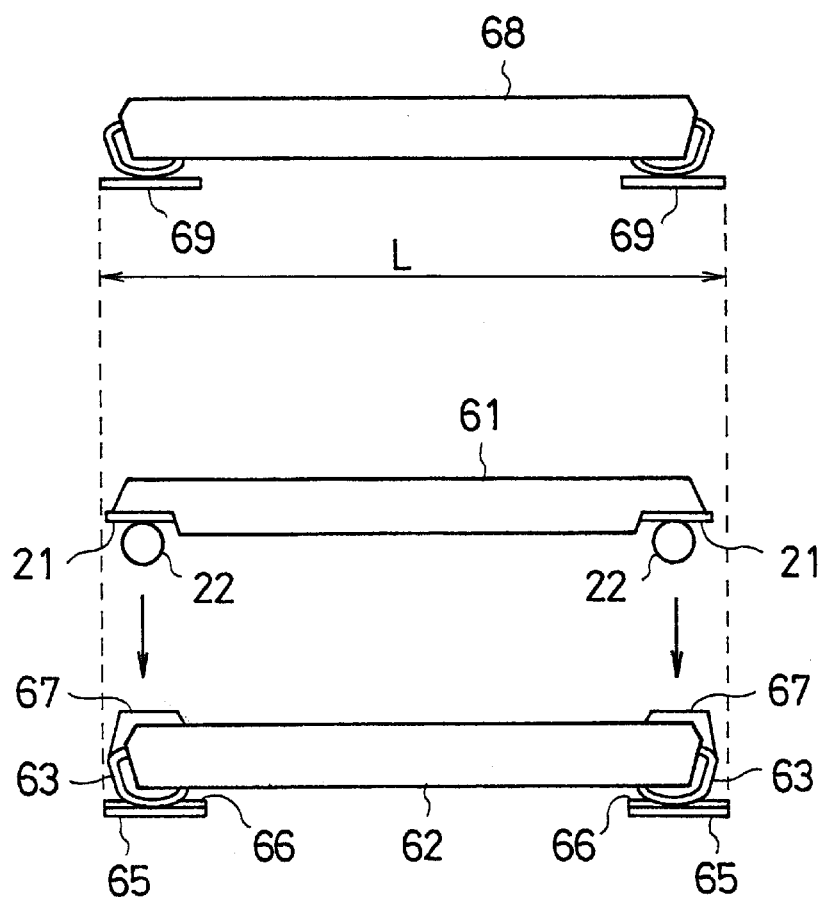
FIG. 14 is an exploded view illustrating the method for manufacturing the stack type semiconductor device in the fifth embodiment of the present invention, while concurrently mounting it at a substrate surface.
Figure 15:
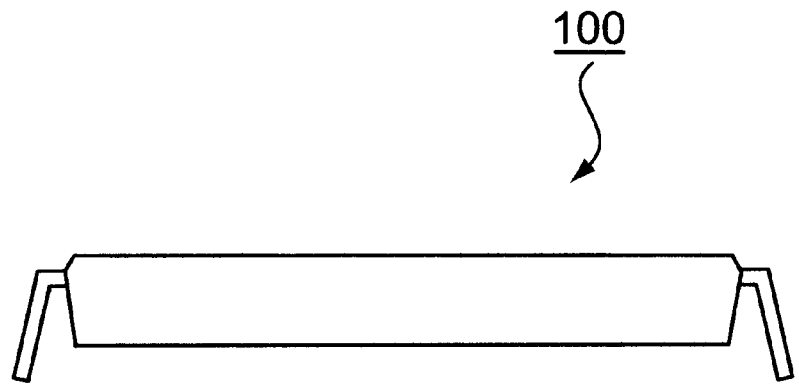
FIG. 15 is a front view of a DIP type semiconductor device.
Figure 16:
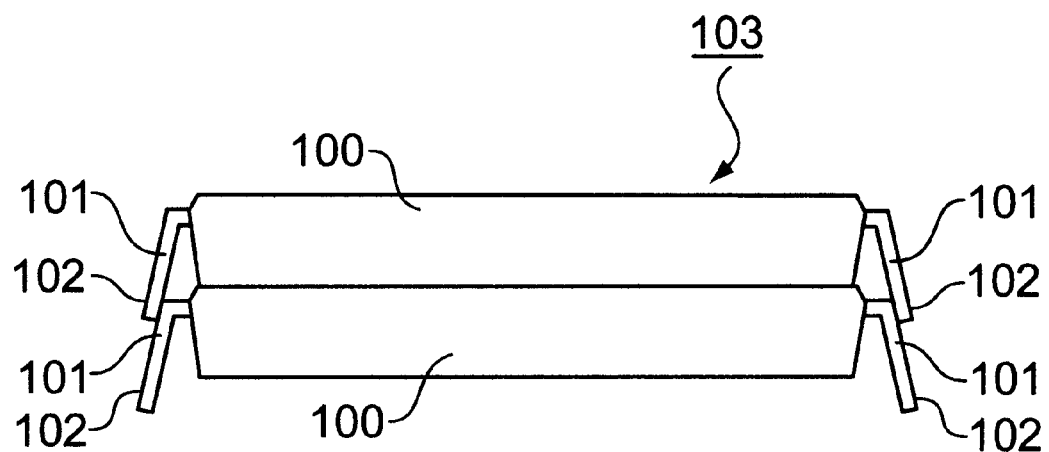
FIG. 16 is a front view of semiconductor devices in a stack type semiconductor device achieved by stacking DIP type semiconductor devices vertically.
Figure 17:
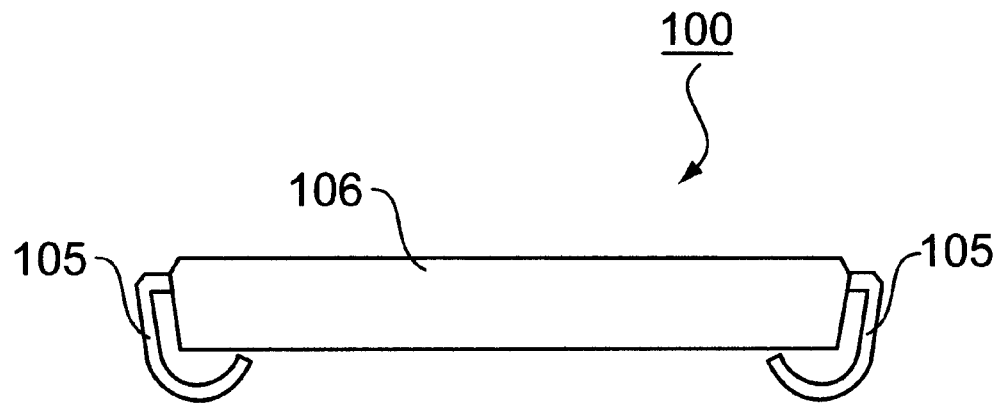
FIG. 17 is a front view of an SOJ type semiconductor device.
Figure 18:
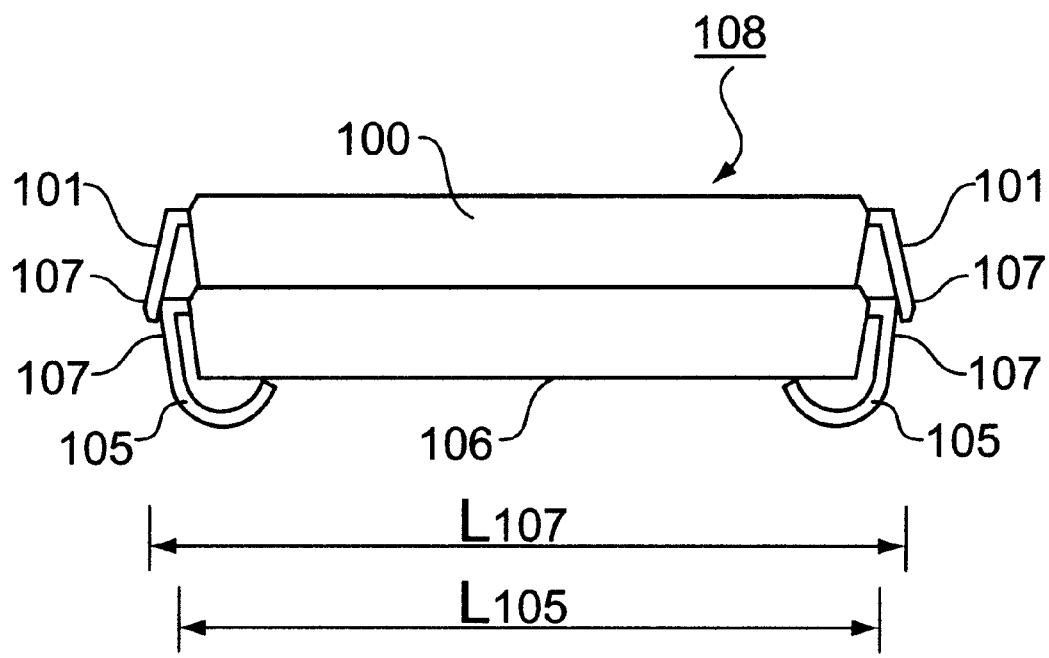
FIG. 18 is a front view of the stack type semiconductor device constituted by stacking a DIP type semiconductor device at the front surface of an SOJ type semiconductor device.

Next, FIG. 13 is a front view of the stack type semiconductor device 5 in the fifth embodiment of the present invention and FIG. 14 is an exploded view illustrating the method for manufacturing the stack type semiconductor device 5 while concurrently mounting it at a substrate surface. As illustrated in FIG. 13, the stack type semiconductor device 5 is constituted by stacking a second semiconductor device 62 at the rear surface (the lower surface in the example presented in the figure) of a first semiconductor device 61.

While FIG. 13 illustrates a state in which the solder balls 22 have melted and become deformed, the structure of the first semiconductor device 61 is identical to that of the second semiconductor device 20 explained earlier in reference to FIGS. 2–4 as clearly illustrated in FIG. 14, and therefore the same reference numbers as those in FIG. 2 are assigned to identical components to preclude the necessity for a detailed explanation thereof. The second semiconductor device 62, on the other hand, is constituted of a so-called SOJ (Small Outline J-bend Package)semiconductor device. Namely, leads 63 for implementing input/output of an electrical signal for a semiconductor element (not shown) that is internally provided in the second semiconductor device 62 are provided at the two sides to the left and right of the second semiconductor device 62.A plurality of leads 63, each bent inward to achieve a "J" shape, are provided at each of the two sides to the left and right of the second semiconductor device 62. The stack type semiconductor device 5 is achieved by electrically connecting the leads 22 of the first semiconductor device 61 and the leads 63 of the second semiconductor device 62 via the melted solder balls 22 in a state in which the second semiconductor device 62 is stacked at the rear surface of the first semiconductor device 61.

Now, the process through which the stack type semiconductor device 5 is manufactured while it is concurrently mounted at a substrate surface is explained in reference to FIG. 14. First, a solder paste 66 is applied onto footprint 65 formed at the front surface of the substrate (not shown) and the leads 63 of the second semiconductor device 62 are placed in contact on top. Then, as illustrated in FIG. 14, by stacking the first semiconductor device 61 onto the second semiconductor device 62 after applying a flux 67 on the upper areas where the leads 63 of the second semiconductor device 62 are exposed, the solder balls 22 mounted at the lower surfaces of the leads 21 of the first semiconductor device 61 are placed on top of the flux 67.After this, heat is applied to raise the temperature, to cause the solder balls 22 mounted at the lower surfaces of the leads 21 of the first semiconductor device 61 to melt so that an electrical connection is achieved between the leads 21 and the leads 63 and also to cause the solder 66 applied on the footprints 65 to melt to electrically connect the leads 63 with the footprints 65, thereby simultaneously mounting the first semiconductor device 61 and the second semiconductor device 62 at the substrate surface.

In the stack type semiconductor device 5 in the fifth embodiment, which is manufactured while it is being mounted at a substrate surface in this manner, the solder that is used for connecting the leads 21 of the first semiconductor device 61 and the leads 63 of the second semiconductor device 62 almost never jut out onto the sides and thus, the distance between the outer surfaces of the leads 63 does not increase. Because of this, the external width L of the footprint 65 formed at the substrate surface only needs to be approximately equal to the external width L of the footprints 69 used for mounting the semiconductor device (SOP) 68 widely used in the prior art which is also shown in FIG. 14 for reference, thereby making it possible to achieve high density mounting without having to increase the mounting area. It is to be noted that by forming the leads 63 in the "J" shape, it becomes possible to use the same sockets as those used with SOJ type semiconductor devices in the prior art for testing and the leads 63 can be prevented from becoming deformed as well.

According to the present invention, a stack type semiconductor device which achieves high density mounting without having to increase the mounting area compared to the mounting area required when mounting a single semiconductor device is provided. Furthermore, according to the present invention, a semiconductor device which is ideal for application in such a stack type semiconductor device is provided.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, the present invention may be adopted in a stack type semiconductor device constituted by stacking semiconductor devices over three stages or more instead of two stages. Especially since the leads of the semiconductor devices 2 and 3 explained in reference to FIGS. 7 and 9 are provided lying astride the front and rear surfaces of the semiconductor devices, the leads can be abutted with each other with ease simply by stacking the semiconductor devices and, therefore, prove ideal for application in the production of multistage stack type semiconductor devices.

The entire disclosure of Japanese Patent Application No. 9-215665 filed on Jul. 25, 1997 and Japanese Patent Application No. 9-340660 filed on Nov. 25, 1997 including specifications, claims, drawings and summary is incorporated herein by reference in its entirety.

What is claimed is:

1. A stacked semiconductor device, comprising:

a first semiconductor device; and a second semiconductor device;

wherein said first semiconductor device includes:

a package body having first and second main surfaces and a plurality of side surfaces, wherein each of the plurality of side surfaces is disposed between the first main surface of the package body of said first semiconductor device and the second main surface of the package body of said first semiconductor device; and a plurality of leads, wherein each of the plurality of leads extends from at least one of the plurality of side surfaces of the package body of the first semiconductor device;

wherein said second semiconductor device includes:

a package body having first and second main surfaces and a plurality of side surfaces, wherein each of the plurality of side surfaces is disposed between the first main surface of the package body of said second semiconductor device and the second main surface of the package body of said second semiconductor device; and a plurality of electrodes, wherein each of the plurality of electrodes is disposed on the first main surface of the package body of said second semiconductor device;

wherein the first main surface of the package body of said first semiconductor device is disposed opposite the second main surface of the package body of said second semiconductor device; and wherein each of the plurality of leads has a bend such that each of the plurality of leads is electrically connected to a corresponding one of the plurality of electrodes, and said second semiconductor device is disposed between the leads.

2. A stacked semiconductor device according to claim 1, wherein each of the plurality of leads has an end that is disposed opposite the corresponding one of the plurality of electrodes.

3. A stacked semiconductor device according to claim 1, further comprising a plurality of solder balls, wherein each of said plurality of solder balls is disposed in contact with one of the plurality of leads and the corresponding one of the plurality of electrodes.

4. A stacked semiconductor device according to claim 3, wherein each of the plurality of leads has an end that is disposed opposite the corresponding one of the plurality of electrodes.

5. A stacked semiconductor device according to claim 1, further comprising a plurality of footprints formed of a conductive material, wherein each of the plurality of leads is disposed in contact with a corresponding one of the footprints, such that each of the leads is electrically connected to the corresponding one of the plurality of electrodes through the corresponding one of said plurality of footprints.

6. A stacked semiconductor device according to claim 5, further comprising a plurality of solder balls, wherein each of said plurality of solder balls is disposed in contact with one of the plurality of electrodes and the corresponding one of said plurality of footprints.

7. A stacked semiconductor device, comprising:

a first semiconductor device; and a second semiconductor device;

wherein said first semiconductor device includes:

a package body having first and second main surfaces and plurality of side surfaces, wherein each of the plurality of side surfaces is disposed between the first main surface of the package body of said first semiconductor device and the second main surface of the package body of said first semiconductor device; and a plurality of electrodes, wherein each of the plurality of electrodes extends from the first main surface of the package body of said first semiconductor device to the second main surface of the package body of said first semiconductor device, such that one end of each of the plurality of electrodes is disposed on the second surface of the package body of said first semiconductor device;

wherein said second semiconductor device includes:
a package body having first, second, and third main surfaces and a plurality of side surfaces, wherein each of the plurality of side surfaces is disposed between the second main surface of the package body of said second semiconductor device and the third main surface of the package body of said second semiconductor device, and wherein the third main surface of the package body of said second semiconductor device is disposed between the plurality of side surfaces of the package body of said second semiconductor device and the first main surface of the package body of said second semiconductor device; and a plurality of electrodes, wherein each of the plurality of electrodes is disposed on the third main surface of the package body of said second semiconductor device; and wherein one of the first main surface and the second main surface of the package body of said first semiconductor device is disposed opposite the first and third main surfaces of the package body of said second semiconductor device, such that each of the plurality of electrodes of said second semiconductor device is electrically connected to a corresponding one of the electrodes of said first semiconductor device.

8. A stacked semiconductor device according to claim 7, wherein said first semiconductor device further comprises a plurality of solder balls, wherein each of the solder balls is disposed on a corresponding one of the electrodes of said first semiconductor device.

9. A stacked semiconductor device according to claim 8, wherein the first main surface of the package body of said first semiconductor device is disposed opposite the first main surface of the package body of said second semiconductor device.

10. A stacked semiconductor device according to claim 8, wherein the second main surface of the package body of said first semiconductor device is disposed opposite the first main surface of the package body of said second semiconductor device.

11. A stacked semiconductor device according to claim 7, wherein the package body of said first semiconductor device further includes a third main surface disposed such that the first main surface of the package body of said first semiconductor device is disposed between said plurality of side surfaces of the package body of the first semiconductor device and the third main surface of the package body of the first semiconductor device.

12. A stacked semiconductor device, comprising:
a first semiconductor device; and
a second semiconductor device;

wherein said first semiconductor device includes:
a package body having first and second main surfaces and a plurality of side surfaces, wherein each of the plurality of side surfaces is disposed between the first main surface of the package body of said first semiconductor device and the second main surface of the package body of said first semiconductor device; and a plurality of leads, wherein each of the plurality of leads extends from at least one of the side surfaces of the package body of said first semiconductor device such that one end of each of the plurality of leads is disposed opposite the second main surface of the package body of said first semiconductor device;

wherein said second semiconductor device comprises:
a package body having first, second, and third main surfaces and a plurality of side surfaces, wherein each of the plurality of side surfaces is disposed between the second main surface of the package body of said second semiconductor device and the third main surface of the package body of said second semiconductor device, and wherein the third main surface of the package body of said second semiconductor device is disposed between the plurality of side surfaces of the package body of said second semiconductor device and the first main surface of the package body of said second semiconductor device; and a plurality of electrodes, wherein each of the plurality of electrodes is disposed on the third main surface of the package body of said second semiconductor device; and wherein the first and third main surfaces of the package body of said second semiconductor device are disposed opposite the first main surface of the package body of said first semiconductor device, and each of the plurality of leads is electrically connected with corresponding ones of the electrodes by a conductive material.

13. A stacked semiconductor device according to claim 12, wherein the conductive material includes solder.

* * * * *